(12) United States Patent
Baldwin et al.

(10) Patent No.: US 6,249,230 B1
(45) Date of Patent: Jun. 19, 2001

(54) GROUND FAULT LOCATION SYSTEM AND GROUND FAULT DETECTOR THEREFOR

(75) Inventors: Thomas L. Baldwin; Damir Novosel; Ali F. Imece, all of Cary, NC (US)

(73) Assignee: ABB Power T&D Company Inc., Raleigh, NC (US)

( * ) Notice: Subject to any disclaimer, the term of this patent is extended or adjusted under 35 U.S.C. 154(b) by 0 days.

(21) Appl. No.: 09/272,017

(22) Filed: Mar. 18, 1999

(51) Int. Cl.[7] .................................................. G08B 21/00
(52) U.S. Cl. ......................... 340/650; 340/651; 361/42; 361/44
(58) Field of Search .................................... 340/635, 650, 340/651, 657, 658, 660, 664; 361/42, 44, 45, 46, 47, 48, 49, 50, 93, 64

(56) References Cited

U.S. PATENT DOCUMENTS

| 4,020,394 | 4/1977 | Potash | 361/45 |
|---|---|---|---|
| 4,149,208 | * 4/1979 | Fiorentzis | 340/650 |
| 4,206,398 | 6/1980 | Janning | 324/509 |
| 4,546,309 | 10/1985 | Kang et al. | 324/529 |
| 4,685,022 | * 8/1987 | Nichols, III et al. | 361/44 |
| 4,851,782 | 7/1989 | Jeerings et al. | 324/520 |
| 4,878,142 | 10/1989 | Bergman et al. | 361/80 |
| 4,914,381 | * 4/1990 | Narod | 324/117 R |
| 5,023,537 | * 6/1991 | Baits | 318/732 |
| 5,495,384 | 2/1996 | Wallis et al. | 361/64 |
| 5,566,082 | * 10/1996 | Suzuki | 702/59 |
| 5,629,825 | 5/1997 | Wallis et al. | 361/64 |
| 5,751,524 | * 5/1998 | Swindler | 361/42 |
| 5,773,980 | 6/1998 | Yang | 324/525 |
| 5,793,593 | * 8/1998 | Reed et al. | 361/93 |
| 5,983,406 | * 10/1999 | Neiger et al. | 361/42 |
| 6,005,393 | 12/1999 | Baumgartl | 324/509 |

* cited by examiner

Primary Examiner—Van T. Trieu
(74) Attorney, Agent, or Firm—Woodcock Washburn Kurtz Mackiewicz & Norris

(57) ABSTRACT

A ground fault location system is used in a multi-phase ungrounded or high-impedance grounded power network. A signal generator is coupled to the network at a first location and generates for each network phase an individual non-DC voltage signal between such phase and ground. A ground fault detector is coupled to the network at a second location and has a summing device and an annunciator. The summing device is coupled to all of the phases of the network at such second location, sums any current passing therethrough, and produces a sum signal. The annunciator receives the sum signal and provides an indication when such signal is non-zero. Each phase of the network at the second location has a distribution current passing therethrough, the sum thereof normally being substantially zero and resulting in a substantially zero sum signal and the lack of an indication from the annunciator based on such distribution currents. When the second location is on a path between the first location and a ground fault, the individual voltage signal on at least one of the phases generates a fault current thereon through such path and results in a non-zero sum signal and an indication from the annunciator. When the second location is not on such path, none of the individual voltage signals generates a fault current on any phase through such path, resulting in a substantially zero sum signal and the lack of an indication from the annunciator.

17 Claims, 3 Drawing Sheets

GROUND FAULT LOCATION SYSTEM AND GROUND FAULT DETECTOR THEREFOR

FIELD OF THE INVENTION

The present invention relates to a ground fault detector system for detecting a ground fault in a multi-phase ungrounded or high impedance grounded electrical power distribution network, and a ground fault detector used therewith. More particularly, the present invention relates to such a ground fault location system where the detector detects an artificial injected signal.

BACKGROUND OF THE INVENTION

In a power distribution network, one or more distributed phases can become faulted to ground. Reasons for such a ground fault are numerous and known, and include damage to electrical insulation and the connection of a defective device to the power network, among others.

In high-impedance grounded networks and ungrounded networks (i.e., any network where there is no significant current path to ground), phase-to-ground faults produce relatively insignificant values of fault current. Typically, in small isolated-neutral industrial installations, the ground-fault current for a phase fault may be well under an amp. Correspondingly, in a large plant containing miles of cable, such current may be no more than 20 amps. Such currents usually are not of sufficient magnitude for the operation of zero-sequence over-current relays, ground fault relays, fault-sensing circuit breakers, fuses, and similar protective devices to locate and remove such faults. Such protective devices do not have the sensitivity necessary due to the complexity of the current flow pattern between the distributed cable capacitance and the fault.

The primary indication of a ground fault in such a network is a shift in ground potential with respect to phase voltage. Although such indication can be sensed and employed as an alerting device, such indication does not assist in determining the location of the ground fault, which may be anywhere within the network.

An accurate ground fault location system is an important tool that is useful in minimizing the economic and maintenance impact of faults on ungrounded and high impedance grounded networks. The benefits of accurate fault location include reduced switching operations required to isolate a faulted feeder section or load; reduced search efforts to locate a fault, thereby facilitating faster repair time; and greater likelihood that a detected fault will be addressed before a second fault occurs in the network. Accordingly, a need exists for an accurate ground fault location system and a detector therefor.

SUMMARY OF THE INVENTION

The present invention satisfies the aforementioned need by providing a ground fault location system and a detector therefor. The ground fault location system is used in a multi-phase ungrounded or high-impedance grounded electrical power distribution network. The system comprises a signal generator and the ground fault detector. The signal generator is coupled to the network at a first particular network location and generates for each phase of the network an individual non-DC ground fault detection voltage signal between such phase and ground.

The ground fault detector is coupled to the network at a second particular network location separate from the first location and comprises a summing device and an annunciator. The summing device is coupled to all of the phases of the network at such second location, and sums any current passing therethrough and produces at an output thereof a sum signal representative of such summed current. The annunciator is coupled to the output of the summing device to receive the sum signal, and provides an indication when the sum signal is non-zero.

Each phase of the network at the second location has a distribution current passing therethrough and the sum of the distribution current from each phase is normally substantially zero. The zero-sum distribution current at the second location results in a substantially zero sum signal and the annunciator does not provide the indication based on such distribution currents.

When the second location is on a path between the first location and a ground fault, the individual voltage signal on at least one of the phases generates a fault current on such phase through such path. The generated fault current results in a non-zero sum signal and the annunciator provides the indication.

When the second location is not on a path between the first location and a ground fault, none of the individual voltage signals on any of the phases generates a fault current on any phase through such path. The lack of a generated fault current results in a substantially zero sum signal and the annunciator does not provide the indication.

BRIEF DESCRIPTION OF THE DRAWINGS

The foregoing summary, as well as the following detailed description of preferred embodiments of the present invention, will be better understood when read in connection with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF PREFERRED EMBODIMENTS

Figure 1:
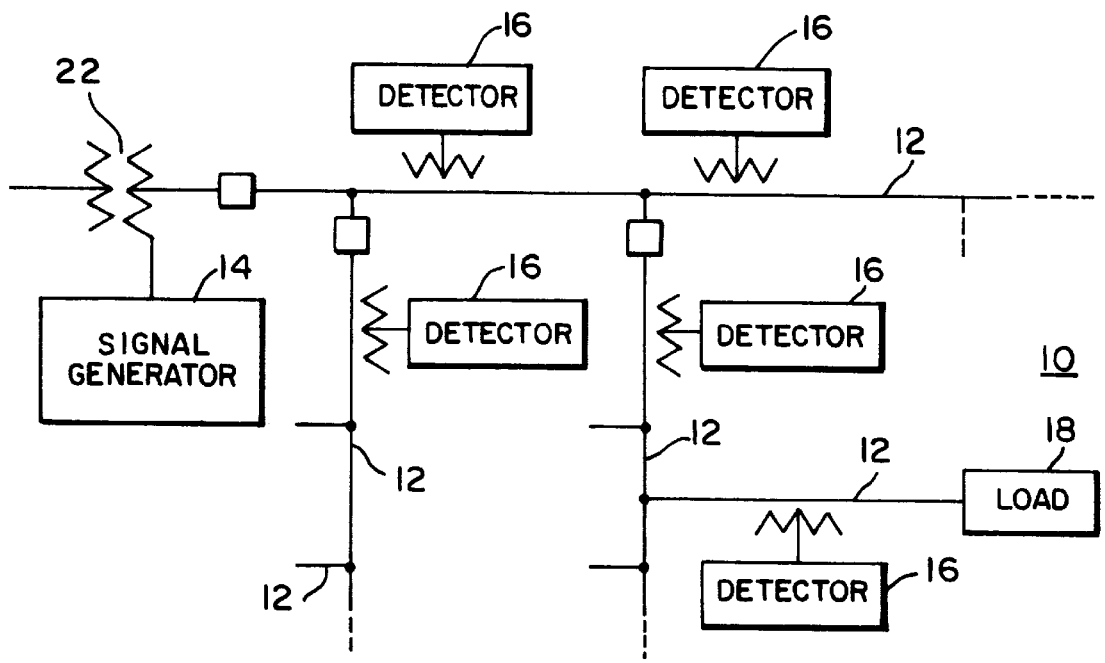
FIG. 1 is a schematic diagram of a ground fault location system for a multi-phase ungrounded or high-impedance grounded electrical power distribution network, in accordance with a preferred embodiment of the present invention.

Certain terminology may be used in the following description for convenience only and is not considered to be limiting. The words "left", "right", "upper", and "lower" designate directions in the drawings to which reference is made. Similarly, the words "inwardly" and "outwardly" are directions toward and away from, respectively, the geometric center of the referenced object. The terminology includes the words above specifically mentioned, derivatives thereof, and words of similar import.

Referring to the drawings in detail, wherein like numerals are used to indicate like elements throughout, there is shown in FIG. 1 a ground fault location system 10 for a multi-phase ungrounded or high-impedance grounded electrical power distribution network 11 in accordance with a preferred embodiment of the present invention. As seen, the network 11 is a branching network including a main branch, feeders, drops, etc. (hereinafter 'branches 12'). However, the network 11 may be any other type of network without departing from the spirit and scope of the present invention. For example, the network 11 may be a non-branching network, a circular network, a multiple path network (having multiple paths between a power source and a load), a multiple power source network, etc. Presumably, one or more loads 18 are attached to the network 11 at branches 12 thereof.

As seen in FIG. 1, the ground fault location system 10 of the present invention includes a signal generator 14 and one or more ground fault detectors 16 positioned at locations on various of the branches 12 of the network 11. In the ungrounded or high-impedance grounded network 11, a ground fault does not complete a viable electric circuit. Accordingly, the system 10 of the present invention completes such viable circuit by coupling the signal generator 14 to ground and having such generator 14 produce a controlled fault voltage signal between each phase of the network 11 and ground (i.e., between a first phase and ground, between a second phase and ground, etc.) .

In particular, the signal generator 14 is coupled to the network 11 at a first particular network location and generates for each phase of the network 11 an individual non-DC ground fault detection voltage signal between such phase and ground. Each ground fault detector 16 is coupled to the network 11 at a respective second particular network location separate from the first location to sense whether fault current based on the fault voltage is flowing at the respective second location from the signal generator 14 toward a ground fault.

As should be understood, such fault current will flow only on those paths which complete the fault circuit. Accordingly, each detector 16 senses whether fault current is flowing at its respective second location, and provides an annunciation if fault current is in fact so flowing. In particular, fault current sensed at a particular second location by a respective detector 16 signifies that such particular second location is on a path to a ground fault. Correspondingly, the failure to sense fault current at a particular second location by a respective detector 16 signifies that such particular second location is not on a path to a ground fault.

By judicious placement of the detectors 16, the path to a ground fault can be quickly defined. However, the system may be operated with a single detector 16 without departing from the spirit and scope of the present invention. Preferably, if only a single detector 16 is employed, such detector is movable by a technician or other appropriate personnel among multiple second locations on the network 11. In such a case, the lone detector 16 will sense whether fault current is present at each particular second location in seriatim, and intelligent movement of such lone detector 16 by such technician can locate a ground fault relatively quickly.

Preferably, the detectors 16 are permanently or semi-permanently positioned/located throughout the network 11 anywhere where it is convenient to determining the location of a ground fault. On branches 12, such detectors 16 are preferably located at regular intervals. Detectors 16 are also preferably located at branching points in the network 11. Accordingly, where a first detector 16 is annunciating and a second detector 16 downstream from the first detector 16 is not annunciating, the ground fault is either between such first and second detectors 16, or is downstream from a branching point between the first and second detectors 16. Put another way, an annunciating detector 16 indicates that a ground fault is downstream therefrom. For example, a detector 16 on a branch 12 to a load 18 will annunciate if such load 18 is the cause of a ground fault.

Preferably, the signal generator 14 is operated in response to the detection of a ground fault, where such ground fault is detected by monitoring shifts in ground potential with respect to each phase. Typically, such monitoring function is performed by an appropriately configured protective relay, fault detector, or the like (not shown). The positive detection of a ground fault thereby is then appropriately reported to a technician or other appropriate personnel. Alternatively, in an automated system, such positive detection automatically triggers the signal generator 14 to begin operating. Any appropriate manual or automatic operation of the signal generator 14 based on a positive detection of a ground fault may be employed without departing from the spirit and scope of the present invention.

Figure 2:
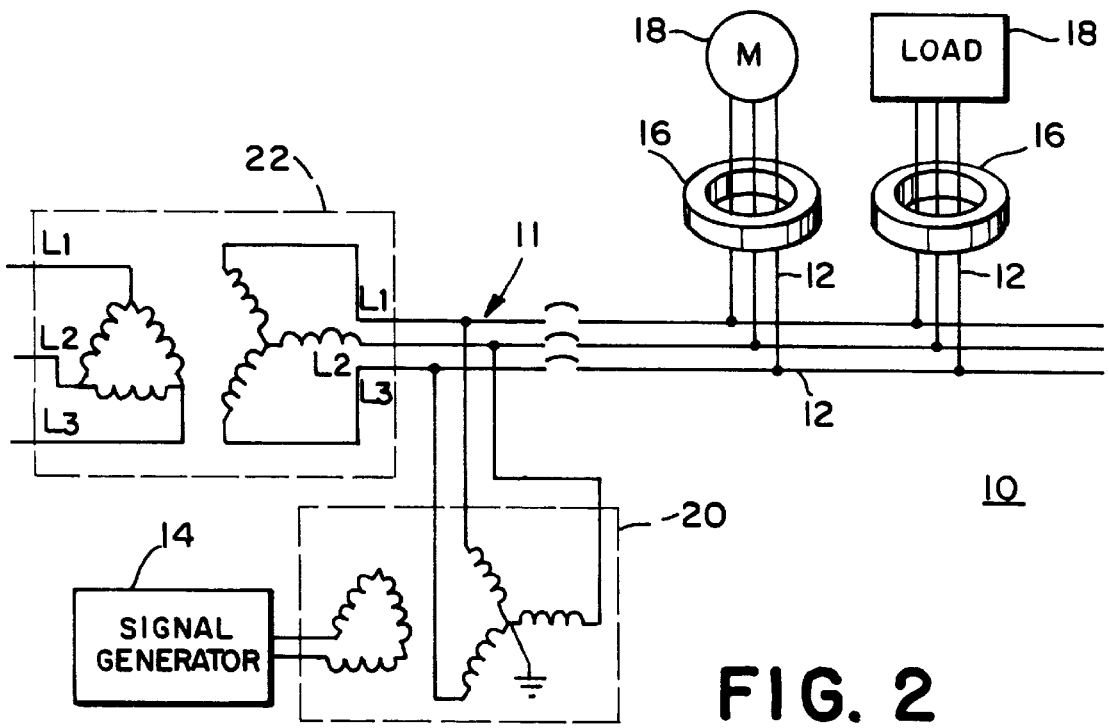
FIG. 2 is a schematic diagram showing aspects of the system of FIG. 1 in more detail.

The signal generator 14 is located at a convenient location in the distribution network 11, such as near the power supplying transformer 22 supplying power to the network 11, as is shown in FIGS. 1 and 2. However, the signal generator 14 may be located at most any convenient location within the network 11 without departing from the spirit and scope of the present invention. Accordingly, the term 'downstream' as used above means downstream with respect to the flow of fault current from the signal generator 14, and not necessarily downstream from the power supplying transformer 22.

Referring now to FIG. 2, it is seen that the signal generator 14 may be coupled to each phase of the network 11 by way of a transformer 20 such as the delta-wye transformer 20, as shown. Notably, such delta-wye transformer 20 is coupled to ground at the neutral center point of the 'wye' so as to provide the return path of the fault current through the ground fault and back to the signal generator 14/transformer 20. Any apparatus for coupling the signal generator 14 to each phase of the a network 11 may be employed without departing from the spirit and scope of the present invention.

As also seen in FIG. 2, with the signal generator 14 and the transformer 20 installed at the head of the main branch 12 of the network 11, and adjacent the power supplying transformer 22, the ground fault detection voltage signal generated by the signal generator 14 on each phase travels from the head of the main branch 12 and down the network 11 to a ground fault. With a detector 16 positioned at each drop 12 adjacent a load 18 being fed by such drop 12, as is shown, if the load 18 to the left (i.e., the motor) is causing a ground fault, the detector 16 to the left on the drop 12 to the left will annunciate. Likewise, if the load 18 to the right is causing the fault, the detector 16 to the right on the drop 12 to the right will annunciate. As should be understood, detectors 16 to the right will not annunciate if the load 18 to the left is causing the fault, for the reason that the fault current will not travel beyond the branch 12 to the load 18 to the left. That is, in such a situation, the detector 16 to the right is not on the path of least resistance to the ground fault associated with the load 18 to the left.

Figure 3:
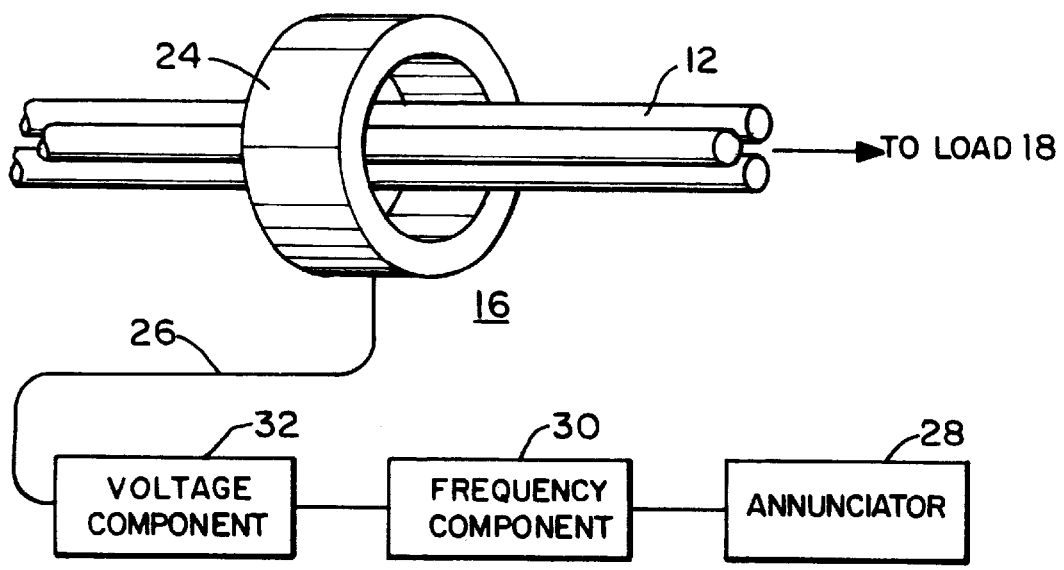
FIG. 3 is a schematic diagram of a ground fault detector employed in connection with the system of FIGS. 1 and 2 in accordance with a preferred embodiment of the present invention.

Referring now to FIG. 3, it is seen that each ground fault detector 16 includes a current transformer 24 that is coupled to all of the phases of the network 11 at the location thereof (i.e., at the second location of such detector 16) such that all phases of the network 11 pass through such current transformer 24. As a result, the current transformer 24 sums any and all currents passing therethrough and transforms such summed current into a transformer voltage (i.e., a sum signal) appearing at an output 26 thereof. As should be understood, then, each detector 16 is self-powered by the voltage produced by the current transformer 24 at the output 26 thereof. As should also be understood, each current transformer 24 comprises an annular core with a series of windings wrapped therearound. The conductors that carry the phases pass through the annulus of the core, with the result being that such conductors act as the transformer primary, and the windings act as the transformer secondary. Any suitable current transformer may be employed as the current transformer 24 without departing from the spirit and scope of the present invention.

Moreover, any suitable device or apparatus for summing the current at the respective second location may be employed without departing from the spirit and scope of the present invention. For example, such device or apparatus may comprise individual transformers, one for each phase, and a summing device summing the respective outputs of such transformers. Alternatively, current-sensing resistors may be appropriately inserted into each phase at a respective second location, and a summing device may be employed to sum the respective voltage drops across such resistors.

Figure 4:
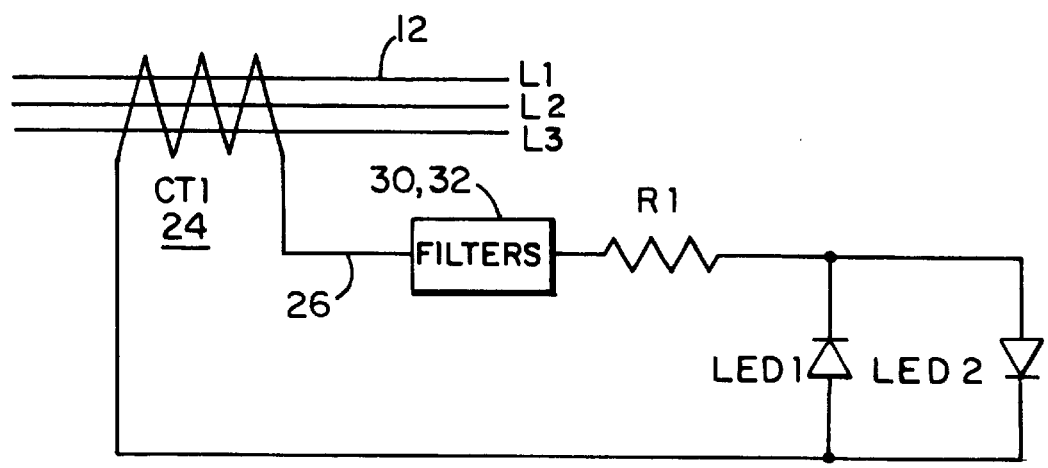
FIG. 4 is a schematic diagram showing aspects of the detector of FIG. 3 in more detail.

Still referring to FIG. 3, each detector 16 also includes an annunciator 28 coupled to the output 26 of the current transformer 24 to receive the transformer voltage (or a modified form thereof) therefrom. The annunciator 28 provides an indication when the transformer voltage at the output 26 of the current transformer 24 is non-zero. Preferably, the annunciator 28 comprises a pair of LEDs, as is seen in FIG. 4. Accordingly, the annunciator provides a light indication from at least one of the LEDs when the transformer voltage reaches a pre-determined minimum turn-on voltage. If necessary, the annunciator 28 may also include a current limiting resistor R1, as seen in FIG. 4, to limit the current through the LEDs. Preferably, the current limiting is selected to limit such current below about 50 milliamps, and the LEDs are selected based on such current. Preferably, the pair of LEDs in the annunciator 28 are connected in anti-parallel, as shown. Accordingly, undesirable feedback that may arise from the non-linear aspects of the LEDs is minimized.

In addition or as an alternative to the LEDs shown in FIG. 4, the annunciator 28 may comprise other indicating/signaling devices, including a relay, a sound-emitting device, a communication signal, and the like, without departing from the spirit and scope of the present invention. If a communication signal is provided from each of several different detectors 16 at several different respective second locations, such signals may be fed back to a central location for centralized signal processing and analysis.

As seen in FIGS. 3 and 4, each detector 16 may additionally include an appropriate frequency limiting filter 30 for frequency limiting the transformer voltage prior to reception by the annunciator 28, and may further include an appropriate voltage limiting filter 32 for voltage limiting the transformer voltage prior to reception by the annunciator 28. Any appropriate type of frequency limiting filter and/or voltage limiting filter may be employed, or no filters at all may be employed, without departing from the spirit and scope of the present invention.

The frequency filtering component 30 may be any of several known filters, including an appropriate R-L-C filter (not shown). Such component 30 preferably limits the frequency of the transformer voltage signal received by the annunciator 28 to a particular range associated with the voltage signal output by the signal generator 14. Accordingly, extraneous noise from a relatively noisy environment does not cause a false annunciator indication. In a relatively quiet environment, the frequency limiting component 30 may not be necessary at all.

The voltage limiting component 32 preferably prevents unusually high transformer voltages at the output 26 of the current transformer 24 from reaching the annunciator 28. Such a voltage limiting component 32 may be an electronic voltage regulator, a metal-oxide varistor (MOV) (not shown), or any other voltage-limiting technology. However, and as will be described below, the voltage limiting component 32 may not in fact be necessary and if so can be removed from the detector 16.

Figure 5:
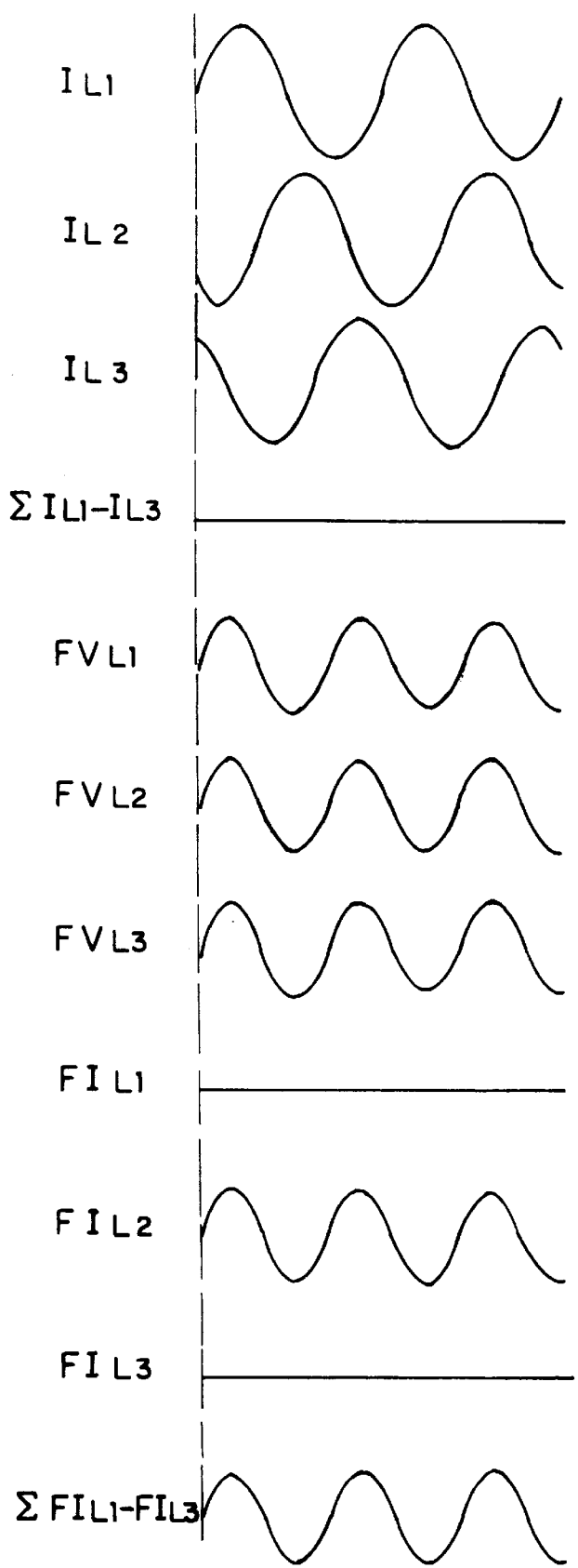
FIG. 5 is a timing diagram explaining the operation of the system and detector shown in FIGS. 1–4.

The operation of the system 10 and detector 16 will now be discussed with particular reference to the timing diagram shown in FIG. 5. As seen in FIG. 5, in a typical 3-phase network of the type shown in FIGS. 2–4, each of the 3 phases L1, L2, L3 has a generally sinusoidal distribution current signal $I_{L1}$, $I_{L2}$, $I_{L3}$ thereon as a distribution current destined for one or more (and perhaps many) loads 18. Normally, such distribution currents are balanced. Accordingly, the sum of the distribution currents $I_{L1}$, $I_{L2}$, $I_{L3}$ is normally substantially zero, as shown at ($\Sigma I_{L1}$–$I_{L3}$) in FIG. 5. Therefore, such zero-sum distribution current $\Sigma I_{L1}$–$I_{L3}$ when passing through the current transformer 24 of any particular detector 16 will produce a substantially zero transformer voltage at the output 26 thereof. As a result, the annunciator 28 receiving the transformer voltage therefrom will not annunciate based upon such zero-sum distribution current.

As seen in FIG. 5, the individual fault voltage signals placed on each of the lines L1–L3 by the signal generator 14 are $FV_{L1}$–$FV_{L3}$, respectively. The fault voltage signals $FV_{L1}$–$FV_{L3}$ may have any non-DC frequency that is appropriate and feasible. For example, such frequency may be 40 hertz, 300 hertz or 1 kilohertz, etc. As seen in FIG. 5, such frequency is slightly higher than the frequency of the distribution currents $I_{L1}$–$I_{L3}$ (typically 50–60 hertz).

Regardless of any load 18 on the system 10, because the signal generator 14 generating the fault voltages $FV_{L1}$–$FV_{L3}$ is grounded, such fault voltages $FV_{L1}$–$FV_{L3}$ will not generate a current through any branch 12 of the network 11 unless such branch 12 is on a path between the signal generator 14 and a ground fault. Put simply, only the ground fault can provide a return for any of such fault voltage signals, and without such return, no fault current will flow in such path.

Still referring to FIG. 5, then, if as an example line L2 is ground faulted, along the path between the signal generator 14 and the ground fault, it is seen that the fault current on lines L1 and L3 ($FI_{L1}$, $FI_{L3}$) is substantially zero, while the fault current on line $L_2$ ($FI_{L2}$) is not substantially zero and is in fact a current signal at the same frequency as the fault voltage on line L2 ($FV_{L2}$). Accordingly, when the fault currents (or lack thereof) from Lines L1–L3 are summed ($\Sigma FI_{L1}$–$FI_{L3}$), a non-zero-sum fault current is found to exist.

As should now be understood based on FIG. 5, a detector 16 placed anywhere on the network 11 will detect all three of the distribution currents $I_{L1}$–$I_{L3}$ passing therethrough, and will normally sum such distribution currents $I_{L1}$–$I_{L3}$ to a substantially zero value ($\Sigma I_{L1}$–$I_{L3}$). As a result, the zero-sum distribution current at the detector 16 will result in a substantially zero transformer voltage at the output 26 of the current transformer 24 of such detector 16. Accordingly, the annunciator 28 of such detector will not provide an indication based on such distribution currents $I_{L1}$–$I_{L3}$.

However, if such detector 16 is on a path between the signal generator 14 and a ground fault, the fault voltage $FV_{L1}$–$FV_{L3}$ on at least one of the phases will generate a fault current $FI_{L1}$–$FI_{L3}$ on such phase through such path, and the generated fault current ($FI_{L2}$ in FIG. 5) will be summed by the current transformer 24 of such detector 16, resulting in a non-zero transformer voltage at the output 26 of such current transformer 24. As should be appreciated, then, such non-zero transformer voltage will cause the annunciator 28 to provide an indication, such as lit LEDs.

In contrast, if such detector 16 is not on a path between the signal generator 14 and a ground fault, none of the individual fault voltage signals $FV_{L1}$–$FV_{L3}$ on any of the phases will generate a fault current $FI_{L1}$–$FI_{L3}$ on any phase through such path. As should now be understood, the lack of any generated fault current will result in a substantially zero transformer voltage on the output 26 of the current transformer 24 of such detector 16, and the annunciator 28 of such detector 16 will not provide any indication.

In a network 11 having a plurality of such detectors 16, then, several of the detectors 16 will (hopefully) be on the path between the signal generator 14 and a ground fault, and the annunciators 28 of such detectors 16 will indicate such path. Accordingly, a maintenance person or technician searching for such ground fault need only follow the path as outlined by such annunciators 28 to the vicinity of such ground fault. Once in such vicinity, visual inspection and other known techniques may be employed to physically locate and remedy such ground fault.

Preferably, the individual fault voltage signals generated by the signal generator 14 ($FV_{L1}$–$FV_{L3}$) are non-zero when summed in any combination thereof. For example, and referring again to FIG. 5, it is seen that the fault voltages $FV_{L1}$–$FV_{L3}$ on lines L1 through L3 are all in-phase. Accordingly, if any combination of lines L1–L3 are ground faulted, the sum of the corresponding combination of fault currents $FI_{L1}$–$FI_{L3}$ resulting from such fault voltages $FV_{L1}$–$FV_{L3}$ will result in a summed waveform of the same frequency and phase as any of the fault currents $FI_{L1}$–$FI_{L3}$, but perhaps a higher amplitude if more than one line L1–L3 is faulted. The importance of the aforementioned non-zero summing of the individual voltage signals on each phase is understood if the scenario is considered wherein a pair of such individual fault voltage signals does sum to zero and the phases of such pair of fault voltages are both ground faulted. In such a scenario, both fault voltages will produce fault currents, but such fault currents will sum to zero and therefore not be detected by the detectors 16.

As was discussed above and referring to the currents $I_{L1}$–$I_{L3}$ shown in FIG. 5, in normal operating conditions, the sum of distribution currents through the network 11 at any particular point ($\Sigma I_{L1}$–$I_{L3}$) will normally be substantially zero, or at least be no larger than a minimal value. However, network fault conditions exist that result in large unsymmetrical (unbalanced) fault currents. Such conditions may for example include phase-to-phase faults. In such situations, the summed network currents at a current transformer 24 of a detector 16 can be of magnitudes of 10,000 to 60,000 amps or higher. Such summed currents and the resulting transformer voltage at the output 26 of such current transformer 24 will damage or destroy such detector 16.

To protect each detector 16, then, from such fault conditions by way of the current transformer 24 coupling, a limiting technology must be employed. As was discussed above, such limiting technology may be the aforementioned voltage limiting component 32 which could take the form of an electronic voltage regulator, a metal-oxide varistor (MOV) or other available technologies. However, in a preferred embodiment in the present invention, such limiting technology comprises the use of a saturating transformer core in the current transformer 24, where such core limits the transformer voltage that appears at the output 26 of such current transformer 24. Unlike electronic voltage regulators or MOVs, a saturating transformer core does not reach a break down threshold that will allow energy to pass on through from the output 26 of the current transformer 24. However, the core must be designed to withstand the mechanical forces of maximum anticipated fault currents.

It is to be noted that the detectors 16 of the present invention will annunciate a path to the location of the phase-to-phase fault, at least during the period before a protective relay or the like detects and isolates such fault. In such an instance, the signal generator 14 need not be operated since the unsymmetrical phase currents will power the annunciating detectors 16. Of course, after the fault has been isolated, an external source of fault-detection power is necessary to continue to power the annunciating detectors 16.

A saturating current transformer 24 operates according to basic current transformer principles, but has a very small amount of iron in the transformer core. The iron content is just sufficient to induce a specified voltage. At a higher current, corresponding to line fault, the output 26 of the saturating current transformer 24 will not be able to deliver much more than a designed nonnal current because the core will not induce more voltage.

As primary current increases in a saturating core transformer, the secondary current increases in proportion, and the flux necessary to induce the necessary voltage to supply the burden will also increase in proportion. If the flux approaches the saturation value in the core, the exciting current will increase more than proportionally and the secondary current accordingly will suffer and will cease to increase proportionally. As the primary current increases still more, the flux in the core will finally be limited by saturation during a considerable part of the cycle. The secondary current, measured as a root mean square, will still continue to increase but it will be very much distorted from a sinusoid wave shape. The phenomena is extremely complicated because the flux tends to leave the part of the core in which the density is highest, and complete its path in air.

In practice, high impedance loading or burden, connected to a current transformer, forces a proportional increase in the output voltage and the magnetic flux. As the flux approaches the saturation value in the core, the exciting current will increase very rapidly and the secondary current will accordingly be noticeably decreased. If the burden is increased to a value which would require a flux above the saturation value to induce the necessary voltage, the flux will not go beyond saturation at the crest, but its rate of change as it goes through zero may be just as high as it would be if it had gone to the full value. In other words, the transformer performs normally during only part of the cycle. It is clear that the secondary current and voltage will be badly distorted from the sinusoidal shape, with the voltage wave showing particularly high peaks. The peaks are practically as high as they would have been had the core not saturated.

If the voltage peak is too high, there is a danger of damaging the connected annunciator 28. For this reason, it is desirable to use magnetic materials having a rectangular hysteresis loop so that, at saturation, the windings exhibit low inductance and minimal kickback. Preferably, the saturating core transformer 24 is formed from a steel such as SUPERMALLOY steel, or from any other steel with good saturation.

Preferably, the current transformer 24 provides a voltage at the output 26 thereof of three to five volts at rated sensing current (typically one to five amps). A maximum voltage should not be more than one or two volts higher than this level. A turn ratio of between about 1:50 and about 1:150 may be employed to obtain sufficient sensitivity to low signal currents, although other turn ratios may be employed as circumstances require without departing from the spirit and scope of the present invention.

The maximum number of turns on the core of the current transformer 24 is dependant on the cross-sectional area of the core. Commercially available cores having cross-sectional areas of about 150 mm² are sufficient. The resulting voltage at the output 26 of the current transformer 28 can be calculated according to the equation:

$$V = 4.444\, B_{max} A_{core} f\, n,$$

where $B_{max}$ is the induction level, which for SUPERMALLOY steel is about 7.3 tesla. $A_{core}$ is the cross-sectional area of the core. f is the system frequency. n is the number of turns on the core.

In the foregoing description it can be seen that the present invention comprises a new and useful ground fault location system and a ground fault detector therefor. It will be appreciated that changes could be made to the embodiments described above without departing from the broad inventive concepts thereof. For example, rather than the signal generator 14—transformer 20 arrangement shown in FIG. 2 for generating the ground fault detection voltage signal on each phase of the network 11, such signal may be generated: by individual signal generators 14, one coupled to each phase; by a single signal generator 14 selectively coupled to all the phases by appropriately controlled relays; or by a single signal generator 14 coupled directly to the center point of a zig-zag transformer, among other arrangements. It is understood, therefore, that this invention is not limited to the particular embodiments disclosed, but it is intended to cover modifications within the spirit and scope of the present invention as defined by the appended claims.

What is claimed:

1. A ground fault location system for a multi-phase ungrounded or high impedance grounded electrical power distribution network, the system comprising:
   a signal generator coupled to the network at a first particular network location, the generator generating for each phase of the network an individual non-DC ground fault detection voltage signal between such phase and ground; and
   a ground fault detector coupled to the network at a second particular network location separate from the first location and comprising:
      a summing device coupled to all of the phases of the network at such second location, the summing device summing any current at such second location and producing at an output thereof a sum signal representative of such summed current; and
      an annunciator coupled to the output of the summing device and receiving the sum signal, the annunciator providing an indication when the sum signal is non-zero;
   wherein when the second location is on a path between the first location and a ground fault, the individual voltage signal on at least one of the phases generates a fault current on such phase through such path, the generated fault current resulting in a non-zero sum signal and the annunciator providing the indication.

2. The system of claim 1 wherein the summing device is a current transformer coupled to all of the phases of the network at such second location such that all phases of the network pass through such current transformer, the current transformer summing any current passing therethrough and transforming such summed current into a transformer voltage, the transformer voltage being the sum signal.

3. The system of claim 2 wherein the current transformer is a saturating transformer having a hard-saturation core that limits the transformer voltage that appears at the transformer output.

4. The system of claim 1:
   wherein each phase of the network at the second location has a distribution current passing therethrough and the sum of the distribution current from each phase is normally substantially zero, the zero-sum distribution current at the second location resulting in a substantially zero sum signal and the annunciator not providing the indication based on such distribution currents; and
   wherein when the second location is not on a path between the first location and a ground fault, none of the individual voltage signals on any of the phases generates a fault current on any phase through such path, the lack of a generated fault current resulting in a substantially zero sum signal and the annunciator not providing the indication.

5. The system of claim 1 wherein the sum of the individual voltage signal on each phase is non-zero with respect to any combination of the phases.

6. The system of claim 1 wherein the annunciator comprises a pair of LEDs connected in anti-parallel and receiving the sum signal and generating a corresponding current therethrough.

7. The system of claim 6 wherein the annunciator further comprises a current limiting resistor for limiting the LED current.

8. The system of claim 1 wherein the annunciator further comprises a frequency limiting filter frequency limiting the sum signal received by the annunciator.

9. The system of claim 1 wherein the annunciator further comprises a voltage limiting filter voltage limiting the sum signal received by the annunciator.

10. The system of claim 1 comprising a plurality of the ground fault detectors coupled to the network at a plurality of particular network locations separate from the first location, wherein for an existing ground fault, for each detector on the path between the first location and such existing ground fault, the corresponding annunciator provides the indication such that the provided indications trace the path from the first location toward such existing ground fault.

11. A method for locating a ground fault in a multi-phase ungrounded or high impedance grounded electrical power distribution network, the method comprising the steps of:
   generating, at a first particular network location, for each phase of the network, an individual non-DC ground fault detection voltage signal between such phase and ground;
   summing, at a second particular network location separate from the first location, any current passing therethrough;

producing a sum signal representative of such summed current; and providing an indication when the sum signal is non-zero;

wherein when the second location is on a path between the first location and a ground fault, the individual voltage signal on at least one of the phases generates a fault current on such phase through such path, the generated fault current resulting in a non-zero sum signal and the indication being provided.

12. The method of claim 11 wherein the producing step comprises the step of transforming such summed current into a transformed voltage, the transformed voltage being the sum signal.

13. The method of claim 11:

wherein each phase of the network at the second location has a distribution current passing therethrough and the sum of the distribution current from each phase is normally substantially zero, the zero-sum distribution current at the second location resulting in a substantially zero sum signal and no indication being providing based on such distribution currents; and wherein when the second location is not on a path between the first location and a ground fault, none of the individual voltage signals on any of the phases generates a fault current on any phase through such path, the lack of a generated fault current resulting in a substantially zero sum signal and the indication not being provided.

14. The method of claim 11 wherein the providing step comprises providing an LED indication from a pair of LEDs connected in anti-parallel and receiving the sum signal and generating a corresponding current therethrough.

15. The method of claim 11 further comprising the step of frequency limiting the sum signal, the providing step comprising providing an indication when the frequency-limited sum signal is non-zero.

16. The method of claim 11 further comprising the step of voltage limiting the sum signal, the providing step comprising providing an indication when the voltage-limited sum signal is non-zero.

17. The method of claim 11 wherein the summing, producing, and providing steps comprise:

at each of a plurality of particular network locations separate from the first location:

summing, at the particular network location, any current passing therethrough;

producing a sum signal representative of such sum current; and providing an indication when the sum signal is non-zero; and tracing a path from the first location toward an existing ground fault based on whether an indication is provided at each of the plurality of locations.

* * * * *